(12) United States Patent
Chae

(10) Patent No.: US 9,997,729 B2
(45) Date of Patent: Jun. 12, 2018

(54) DISPLAY DEVICE

(71) Applicant: Samsung Display Co., Ltd., Yongin-si (KR)

(72) Inventor: Jong Won Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 85 days.

(21) Appl. No.: 15/261,330

(22) Filed: Sep. 9, 2016

(65) Prior Publication Data

US 2017/0185180 A1    Jun. 29, 2017

(30) Foreign Application Priority Data

Dec. 28, 2015  (KR) ........................ 10-2015-0187469

(51) Int. Cl.
*G06F 3/041* (2006.01)
*H01L 51/00* (2006.01)
(Continued)

(52) U.S. Cl.
CPC .......... *H01L 51/0097* (2013.01); *G06F 3/044* (2013.01); *G06F 3/0412* (2013.01);
(Continued)

(58) Field of Classification Search
CPC ............... H01L 51/0097; H01L 27/323; H01L 27/3246; H01L 27/3276; G06F 3/0412; G06F 3/044; G06F 2203/04112
See application file for complete search history.

(56) References Cited

U.S. PATENT DOCUMENTS 9,147,721 B2    9/2015  Hong
9,239,654 B2    1/2016  Jang
(Continued)

FOREIGN PATENT DOCUMENTS

KR    10-2012-0041579    5/2012
KR       10-1373044      3/2014
(Continued)

OTHER PUBLICATIONS

Non-Final Office Action dated Apr. 4, 2018, issued in U.S. Appl. No. 15/402,969.

*Primary Examiner* — Adam R Giesy
(74) *Attorney, Agent, or Firm* — H.C. Park & Associates, PLC

(57) ABSTRACT

A display device may include a first substrate including a plurality of pixel areas, a plurality of display elements disposed in the plurality of pixel areas on the first substrate, respectively, a second substrate facing the first substrate, a plurality of spacers disposed between the plurality of display elements, and a plurality of touch sensing electrodes disposed on a surface of the second substrate facing the first substrate. The display element, among the plurality of display elements, includes a first electrode disposed in a pixel area among the plurality of pixel areas, a pixel defining layer disposed between each pixel area among the plurality of pixel areas and exposing the first electrode, an emission layer disposed on the first electrode and including at least a light generating layer, and a second electrode disposed on the emission layer and extending to the pixel defining layer and the plurality of spacers. The plurality of spacers are disposed on the pixel defining layer and the second electrode includes openings overlapping the plurality of spacers.

14 Claims, 8 Drawing Sheets

(51) Int. Cl.
    *H01L 27/32*     (2006.01)
    *G06F 3/044*     (2006.01)
(52) U.S. Cl.
    CPC ........ *H01L 27/323* (2013.01); *H01L 27/3246* (2013.01); *H01L 27/3276* (2013.01); *G06F 2203/04112* (2013.01)

(56) References Cited

U.S. PATENT DOCUMENTS

| | | |
|---|---|---|
| 9,360,971 B2 | 6/2016 | Barton et al. |
| 9,853,241 B2 * | 12/2017 | Bi .................... H01L 51/525 |
| 2009/0303400 A1 * | 12/2009 | Hou .................. G06F 3/0412 349/12 |
| 2015/0207094 A1 * | 7/2015 | Hwang .............. H01L 51/5203 257/88 |
| 2017/0185180 A1 | 6/2017 | Chae |
| 2017/0185203 A1 | 6/2017 | Seong |
| 2017/0205959 A1 | 7/2017 | Seong |
| 2017/0207277 A1 | 7/2017 | Park |

FOREIGN PATENT DOCUMENTS

| | | |
|---|---|---|
| KR | 10-2014-0062341 | 5/2014 |
| KR | 10-2014-0129134 | 11/2014 |
| KR | 10-2015-0049141 | 5/2015 |
| KR | 10-1588450 | 1/2016 |
| KR | 10-2017-0075909 | 7/2017 |
| KR | 10-2017-0087556 | 7/2017 |
| KR | 10-2017-0087557 | 7/2017 |

* cited by examiner

DISPLAY DEVICE

CROSS-REFERENCE TO RELATED APPLICATION

This application claims priority from and the benefit of Korean Patent Application No. 10-2015-0187469, filed on Dec. 28, 2015, which is hereby incorporated by reference for all purposes as if fully set forth herein.

BACKGROUND

Field

The invention relates generally to a display device, and, more particularly to a display devices incorporating a user-operated touch screen.

Discussion of the Background

A display device including a touch screen attached on a display panel has been developed as an information input device. A user may input information by pressing or touching a touch sensor within the touch screen while viewing an image displayed on the display panel.

Recently, in order to reduce the thickness of a portable terminal, such as a smart phone and a tablet PC, display devices have been developed in which the touch screen is integrated inside the display panel has been developed. Such designs may have insufficient structural support and/or adversely impact the electrical characteristics and performance of the device.

The above information disclosed in this Background section is only for enhancement of understanding of the context of the inventive concept, and, therefore, it may contain information that does not form the prior art that is already known in this country to a person of ordinary skill in the art.

SUMMARY OF THE INVENTION

The invention meets the needs for slimmer portable electronic devices, while avoiding the drawbacks and disadvantages associated with the prior art by providing a touch screen integrated display device, which includes elements for supporting the touch screen therein without adversely affecting the performance of the device.

Exemplary embodiments of the invention provide a display device including a first substrate including a plurality of pixel areas, a plurality of display elements disposed in the plurality of pixel areas on the first substrate, respectively, a second substrate facing the first substrate, a plurality of spacers disposed between the plurality of display elements, and a plurality of touch sensing electrodes disposed on a surface of the second substrate facing the first substrate. The display element, among the plurality of display elements, includes a first electrode disposed in a pixel area among the plurality of pixel areas, a pixel defining layer disposed between each pixel area among the plurality of pixel areas and exposing the first electrode, an emission layer disposed on the first electrode and including at least a light generating layer, and a second electrode disposed on the emission layer and extending to the pixel defining layer and the plurality of spacers. The plurality of spacers are disposed on the pixel defining layer and the second electrode includes openings overlapping the plurality of spacers.

The touch sensing electrodes may include a plurality of conductive fine lines crossing each other. The spacers may be disposed at points, at which the conductive fine lines cross. The display elements may be disposed in regions formed by crossing the plurality of conductive fine lines.

The touch sensing electrodes may include one or more first regions, and one or more second regions electrically separated from the first regions, and the one or more first region may be electrically isolated from the one or more second regions. The second region may surround the first region. The opening may be disposed in the second region.

The display device may further include an encapsulation layer disposed on the second electrode.

The display device may further include a filling material disposed between the first substrate and the second substrate.

Another exemplary embodiment of the invention provides a display device including a first substrate including a plurality of pixel areas, a plurality of first electrodes disposed in the plurality of pixel areas, respectively, a pixel defining layer disposed between each pixel area of the plurality of pixel areas and exposing the plurality of first electrodes, a plurality of spacers disposed on the pixel defining layer, an emission layer disposed on the first electrode and comprising at least a light generating layer, a second electrode disposed on the emission layer and extended to the pixel defining layer and the plurality of spacers, a second substrate facing the first substrate, and a plurality of touch sensing electrodes disposed on a surface of the second substrate facing the second electrode and including a plurality of conductive fine lines crossing each other. The plurality of touch sensing electrodes comprises electrically isolated regions inside the plurality of touch sensing electrodes, and the plurality of conductive fine lines disposed in the isolated regions are electrically separated from the plurality of conductive fine lines disposed in an other region. The second electrode includes openings overlapping the plurality of spacers in the other region.

The foregoing general description and the following detailed description are exemplary and explanatory and are intended to provide further explanation of the claimed subject matter, which are defined solely by the appended claims.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1:
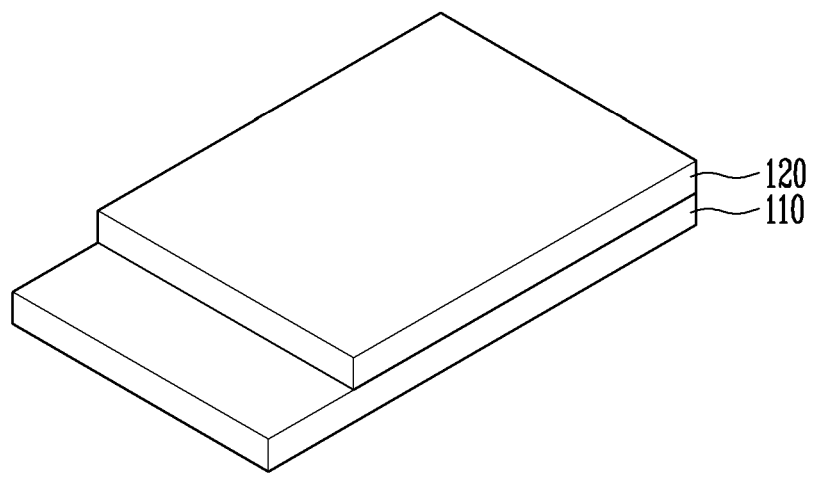
FIG. 1 is a perspective view illustrating a display device constructed according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
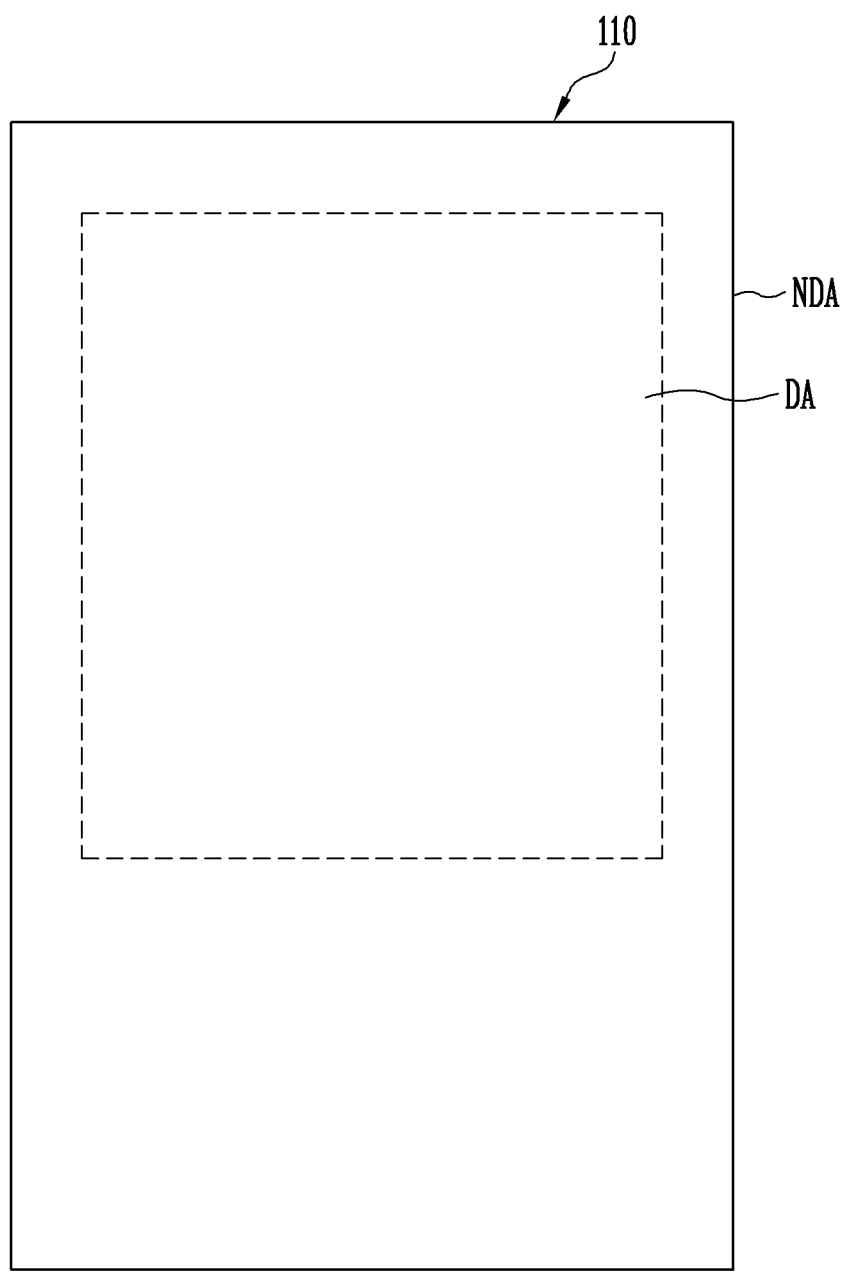
FIG. 2 is a top plan view illustrating a first substrate of FIG. 1.
Figure 3:
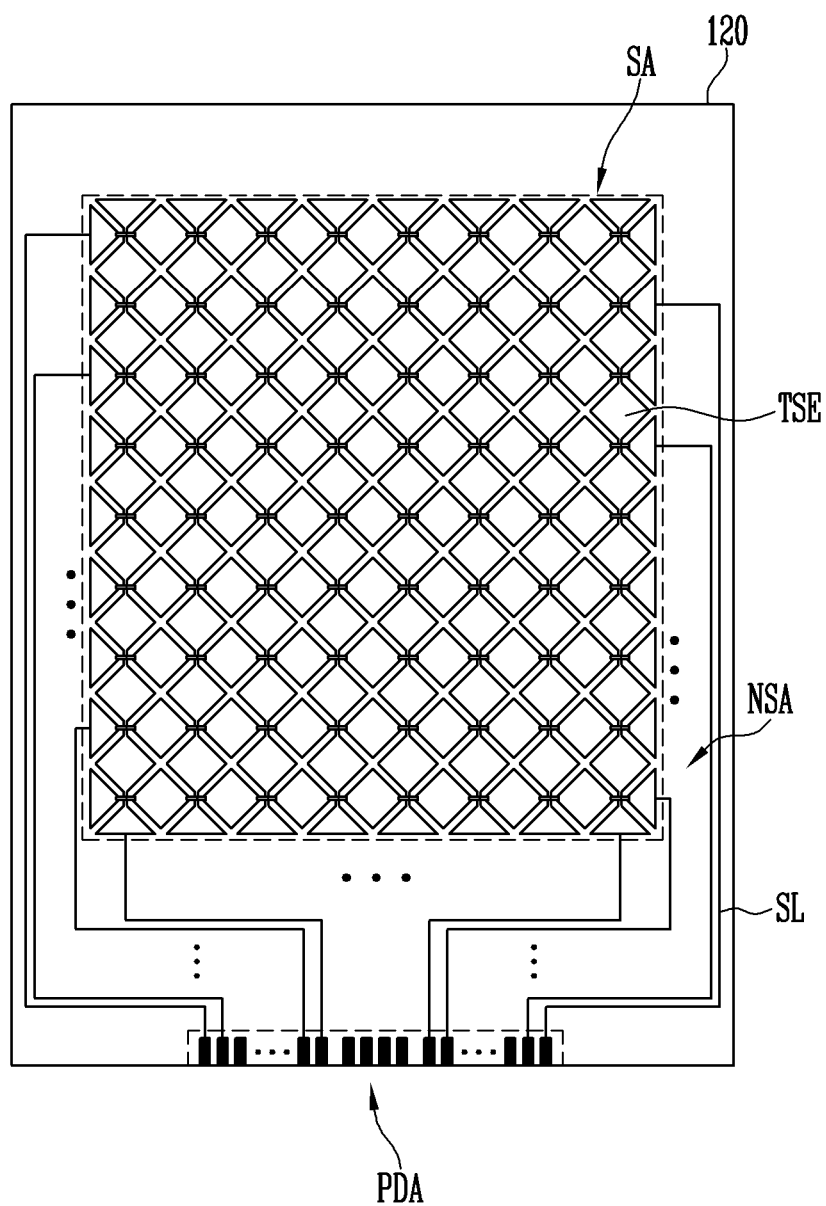
FIG. 3 is a top plan view illustrating a second substrate of FIG. 1.

FIG. 1 is a perspective view illustrating a display device according to an exemplary embodiment of the invention, FIG. 2 is a top plan view illustrating a first substrate of FIG. 1, and FIG. 3 is a top plan view illustrating a second substrate of FIG. 1.

Referring to FIGS. 1, 2, and 3, the display device may include a first substrate 110, display elements (not illustrated) disposed on the first substrate 110, a second substrate 120 facing the first substrate 110, and touch sensing electrodes TSE disposed on a surface of the second substrate 120 facing the first substrate 110.

The first substrate 110 may include a display area DA and a non-display area NDA. The display area DA may include a plurality of pixel areas (not shown in FIG. 2). The non-display area NDA may be disposed to be adjacent to the display area DA.

Further, the first substrate 110 may include a plurality of gate lines (not illustrated), a plurality of data lines (not illustrated) crossing the gate lines, and a plurality of thin film transistors (not illustrated) connected to the gate lines and the data lines. Each display element may be connected to one of the thin film transistors.

The display elements may be disposed in the pixel areas on the first substrate 110. Further, the display element may be any one of a liquid crystal display device (LCD device), an electrophoretic display device (EPD device), an electrowetting display device (EWD device), and an organic light emitting display device (OLED device). For convenience, the OLED device is used herein as an example of the display element.

The display element may include a first electrode connected to the thin film transistor, an emission layer disposed on the first electrode, and a second electrode disposed on the emission layer. The emission layer may include a light generating layer, which generates light by a recombination of electrons and holes injected through the first electrode and the second electrode.

The second substrate 120 may include a sensing area SA and a non-sensing area NSA. The sensing area SA may correspond to the display area DA of the first substrate 110. The non-sensing area NSA may be disposed to be adjacent to the sensing area SA. Further, the non-sensing area SA may correspond to the non-display area NDA of the first substrate 110.

The touch sensing electrodes TSE may be disposed in the sensing area SA on a surface of the second substrate 120 facing the first substrate 110, and may be connected to a pad portion through sensing lines SL. The touch sensing electrodes TSE may be disposed in various forms according to a touch sensing form of the display device.

For example, as illustrated in FIG. 3, the touch sensing form of the display device may be a mutual capacitance touch screen type. Here, some of the touch sensing electrodes TSE may include a plurality of touch sensing electrode rows, which are connected in a predetermined direction and are parallel to each other. Further, the remaining touch sensing electrodes TSE may include a plurality of touch sensing electrode columns, which are connected in a direction crossing the touch sensing electrode rows and are parallel to each other. The touch sensing electrode rows and the touch sensing electrode columns may be connected to pads of the pad portion PDA through the sensing lines SL, respectively.

Figure 4:
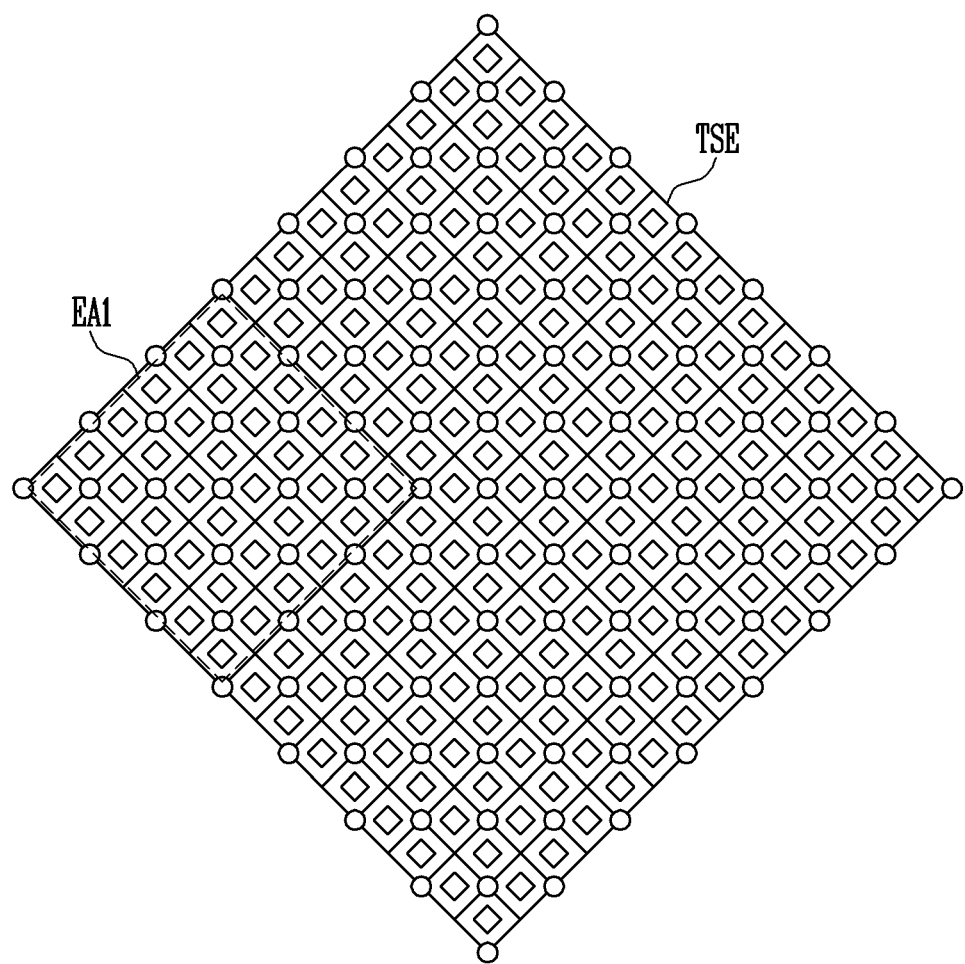
FIG. 4 is a top plan view illustrating a region, in which touch sensing electrodes are disposed, in the display device of FIG. 1.
Figure 5:
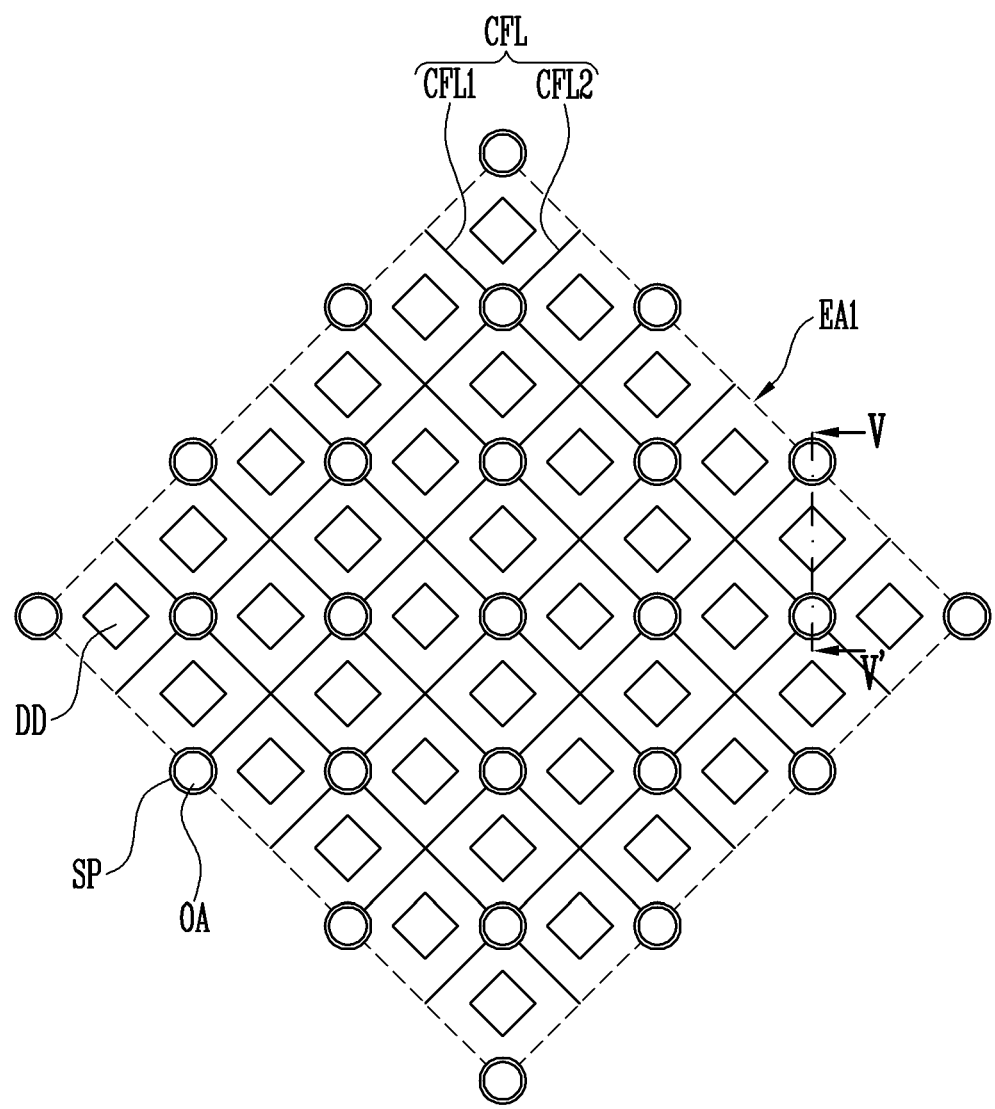
FIG. 5 is an enlarged top plan view of region EA1 of FIG. 4.
Figure 6:
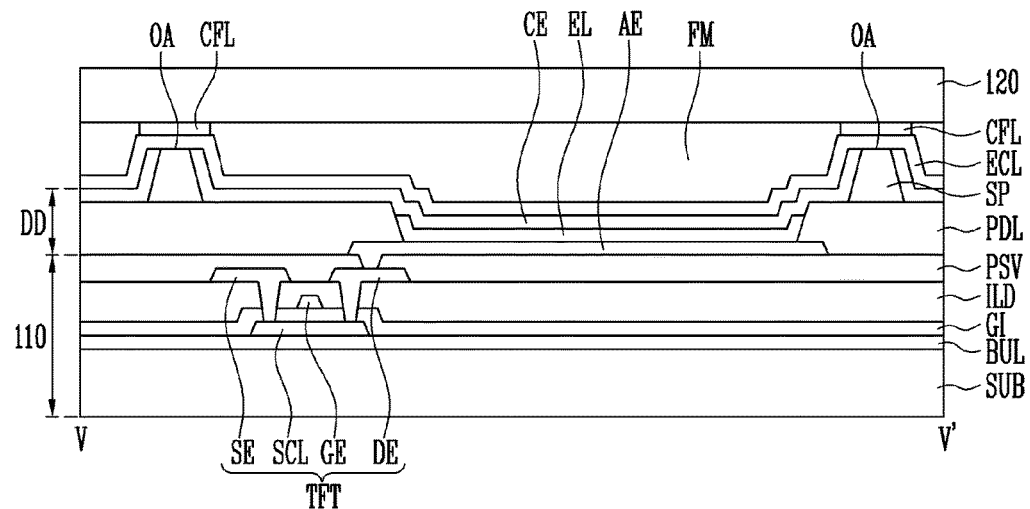
FIG. 6 is a cross-sectional view taken along line V-V of FIG. 5.

FIG. 4 is a top plan view illustrating a region, in which the touch sensing electrodes are disposed, in the display device of FIG. 1, FIG. 5 is an enlarged top plan view of region EA1 of FIG. 4, and FIG. 6 is a cross-sectional view taken along line V-V' of FIG. 5.

Referring to FIGS. 1, 2, 3, 4, 5, and 6, the display device may include the first substrate 110, display elements DD disposed on the first substrate 110, the second substrate 120 facing the first substrate 110, and the touch sensing electrodes TSE disposed on a surface of the second substrate 120 facing the first substrate 110.

The first substrate 110 may include the display area DA and the non-display area NDA. The display area DA may include a plurality of pixel areas. The non-display area NDA may be disposed to be adjacent to the display area DA. Further, the first substrate 110 may include a base substrate SUB, and one or more thin film transistors TFT disposed in each pixel area on the base substrate SUB.

The base substrate SUB may include a transparent insulating material to allow light to pass through. Further, the base substrate SUB may be a rigid substrate or a flexible substrate. The rigid substrate may include at least one of a glass substrate, a quartz substrate, a glass ceramic substrate, and a crystalline glass substrate. The flexible substrate may include at least one of a film substrate and a plastic substrate including a polymer organic material. For example, the flexible substrate may include at least one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), cellulose acetate propionate (CAP), and fiberglass reinforced plastic (FRP).

A material included in the base substrate SUB may have resistance to a high processing temperature which may be present during a fabricating process of the display device (heat resistance).

A buffer layer BUL may be disposed between the base substrate SUB and the thin film transistor TFT. The buffer layer BUL may include at least one of a silicon oxide and a silicon nitride. For example, the buffer layer BUL may include a first insulating layer including a silicon oxide, and a second insulating layer, which is disposed on the first insulating layer and includes a silicon nitride. The buffer layer BUL may prevent impurities from being dispersed from the base substrate SUB to the thin film transistor TFT. Further, the buffer layer BUL may flatten a surface of the base substrate SUB.

The thin film transistor TFT may be connected to the gate line and the data line. The thin film transistor TFT may include a semiconductor layer SCL, a gate electrode GE, a source electrode SE, and a drain electrode DE.

The semiconductor layer SCL may be disposed on the buffer layer BUL. The semiconductor layer SCL may include one of amorphous silicon (a-Si), polycrystalline silicon (p-Si), an oxide semiconductor, and an organic semiconductor. In the semiconductor layer SCL, regions connected with the source electrode SE and the drain electrode DE may be a source region and a drain region having impurities doped thereon or injected into. A region between the source region and the drain region may be a channel region.

Although not illustrated, when the semiconductor layer SCL includes an oxide semiconductor, a light blocking layer for blocking light incident to the semiconductor layer SCL may also be disposed on an upper or lower portion of the semiconductor layer SCL.

A gate insulating layer GI may be disposed on the semiconductor layer SCL. The gate insulating layer GI may cover the semiconductor layer SCL, and may insulate the semiconductor layer SCL and the gate electrode GE. The gate insulating layer GI may include at least one of a silicon oxide layer and a silicon nitride layer.

The gate electrode GE may be disposed on the gate insulating layer GI. The gate electrode GE may be connected to the gate line. The gate electrode GE may include a low-resistant conductive material, and may overlap the semiconductor layer SCL.

An interlayer insulating layer ILD may be disposed on the gate electrode GE. The interlayer insulating layer ILD may include the same material as that of the gate insulating layer GI. The interlayer insulating layer ILD may insulate the source electrode SE, the drain electrode DE, and the gate electrode GE.

Contact holes passing through the gate insulating layer GI and the interlayer insulating layer ILD may expose the source region and the drain region of the semiconductor layer SCL.

The source electrode SE and the drain electrode DE may be spaced apart from each other on the interlayer insulating layer ILD. The source electrode SE and the drain electrode DE may include a low-resistant conductive material. One end of the source electrode SE may be connected to the data line. The other end of the source electrode SE may be connected to the source region through one of the contact holes. One end of the drain electrode DE may be connected to the drain region through another contact hole. The other end of the drain electrode DE may be connected to one of the display elements DD.

In the exemplary embodiments, a case where the thin film transistor TFT is a thin film transistor having a top gate structure has been described as an example, but the thin film transistor is not limited thereto. For example, the thin film transistor TFT may also be a thin film transistor having a bottom gate structure.

A passivation layer PSV may be disposed on the base substrate SUB on which the thin film transistors TFT are disposed. That is, the passivation layer PSV may cover the thin film transistors TFT. A part of the passivation layer PSV may be removed to expose the drain electrode DE.

The passivation layer PSV may include at least one layer. For example, the passivation layer PSV may include an inorganic passivation layer and an organic passivation layer disposed on the inorganic passivation layer. The inorganic passivation layer may include at least one of a silicon oxide and a silicon nitride. The organic passivation layer may include one of acryl, polyimide (PI), polyamide (PA), and benzocyclobutene (BCB). Further, the organic passivation layer may be a flattening layer, which is transparent and flexible to smooth and flatten a curved or non-flat portion of a lower structure.

The display elements DD may be disposed on the passivation layer PSV. The display element DD may include a first electrode AE connected with the drain electrode DE, an emission layer EL disposed on the first electrode AE, and a second electrode CE disposed on the emission layer EL.

One of the first electrode AE and the second electrode CE may be an anode electrode and the other may be a cathode electrode. For example, the first electrode AE may be an anode electrode, and the second electrode CE may be a cathode electrode.

Further, at least one of the first electrode AE and the second electrode AE may be a transmissive electrode. For example, when the display element DD is a bottom emission organic light emitting device, the first electrode AE may be a transmissive electrode, and the second electrode CE may be a reflective electrode. When the display element DD is a top emission organic light emitting device, the first electrode AE may be a reflective electrode, and the second electrode CE may be a transmissive electrode. For example, when the organic light emitting display device is a dual-type organic light emitting device, both the first electrode AE and the second electrode CE may be transmissive electrodes. In the present exemplary embodiment, a case where the display elements DD are the top emission organic light emitting devices, and the first electrode AE is an anode electrode will be described as an example.

In each pixel area, the first electrode AE may be disposed on the passivation layer PSV. The first electrode AE may include a reflective layer (not illustrated), which is capable of reflecting light, and a transparent conductive layer (not illustrated) disposed on an upper or lower portion of the reflective layer. At least one of the transparent conductive layer and the reflective layer may be connected with the drain electrode DE.

The reflective layer may include a material which is capable of reflecting light. For example, the reflective layer may include at least one of aluminum (Al), silver (Ag), chrome (Cr), molybdenum (Mo), platinum (Pt), nickel (Ni), and an alloy thereof.

The transparent conductive layer may include a transparent conductive oxide. For example, the transparent conductive layer may include at least one transparent conductive oxide among an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), and a fluorine doped tin oxide (FTO).

A pixel defining layer PDL may be disposed on the first electrode AE. The pixel defining layer PDL may be disposed between the pixel areas, and may leave the first electrode AE exposed. Further, the pixel defining layer PDL may overlap an edge portion of the first electrode AE. Accordingly, the pixel defining layer PDL may leave most of the surface of the first electrode AE abutting the second substrate 120 exposed.

The pixel defining layer PDL may include an organic insulating material. For example, the pixel defining layer PDL may include at least one of polystyrene, polymethylmetaacrylate (PMMA), polyacrylonitrile (PAN), polyamide (PA), polyimide (PI), polyarylether (PAE), heterocyclic polymer, parylene, epoxy, benzocycloubutene (BCB), siloxane based resin, and silane based resin.

A plurality of spacers SP may be disposed on the pixel defining layer PDL. The spacers SP may maintain a distance between the first substrate 110 and the second substrate 120. Even tough external pressure is applied to the first substrate 110 or the second substrate 120, the spacers SP may prevent the display elements DD from being damaged due to a contact of the second substrate 120 with the display elements DD.

The spacers SP may include an organic insulating material. For example, the spacers SP may include the same material as that of the pixel defining layer PDL.

The emission layer EL may be disposed on an exposed surface of the first electrode AE. The emission layer EL may have a multi-layer thin film structure including at least a light generating layer. For example, the emission layer EL may include a hole injection layer for injecting holes, a hole transport layer, which has an excellent hole transporting property and suppresses a movement of an electron which failed to be combined in light generating layer to increase an opportunity for the holes and the electrons to be re-combined. The emission layer EL may also include the light generating layer which may emit light by the re-combination of the injected electrons and holes, a hole blocking layer for suppressing a movement of the holes which failed to be combined in the light generating layer, an electron transport layer for smoothly transporting electrons to the light generating layer, and an electron injection layer for injecting electrons.

A color of light generated in the emitting layer may be one of red, green, blue, and white, but this is not limited in the present exemplary embodiment. For example, a color of light generated in the light generating layer of the emission layer EL may be one of magenta, cyan, and yellow.

The hole injection layer, the hole transport layer, the hole blocking layer, the electron transport layer, and the electron injection layer may be common layers connected to the adjacent pixel areas.

The second electrode CE may be disposed on the emission layer EL. Further, the second electrode CE may be extended to the pixel defining layer PDL and the spacers SP.

The second electrode CE may be a semi-transmissive reflective layer. For example, the second electrode CE may be a thin metal layer having a thickness, in which light may pass through. The second electrode CE may allow a part of light generated in the light generating layer to pass through, and may reflect the remaining light generated in the light generating layer.

The second electrode CE may include a material having a lower work function than that of the transparent conductive layer. For example, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy thereof.

A part of the light emitted from the emission layer EL may fail to pass through the second electrode CE, and the light reflected from the second electrode CE may be reflected from the reflective layer again. That is, the light emitted from the emission layer EL may be resonated between the reflective layer and the second electrode CE. Light extraction efficiency of the display elements DD may be improved by the resonance of the light.

A distance between the reflective layer and the second electrode CE may be different according to a color of the light generated in the light generating layer. That is, a distance between the reflective layer and the second electrode CE may be adjusted to be accorded with a resonance distance of the color of light generated in the light generating layer.

An encapsulation layer ECL may be disposed on the second electrode CE. The encapsulation layer ECL may prevent oxygen and moisture from permeating into the display elements DD. The encapsulation layer ECL may include a plurality of inorganic layers (not illustrated) and a plurality of organic layers (not illustrated). For example, the encapsulation layer ECL may include a plurality of unit encapsulation layers including the inorganic layer and the organic layer disposed on the inorganic layer. Further, the inorganic layer may be disposed in the lowermost portion and the topmost portion of the encapsulation layer ECL. The inorganic layer may include at least one of a silicon oxide, a silicon nitride, a silicon oxynitride, an aluminum oxide, a titanium oxide, a zirconium oxide, and a tin oxide.

The second substrate 120 may isolate the display elements DD from an external environment. Further, the second substrate 120 may include the same material as that of the base substrate SUB. The second substrate 120 may be bonded to the first substrate 110 through a sealant.

The second substrate 120 may include the sensing area SA and the non-sensing area NSA disposed to be adjacent to the sensing area SA. The sensing area SA may correspond to the display area DA of the first substrate 110. The non-sensing area NSA may be disposed to be adjacent to the sensing area SA. Further, the non-sensing area SA may correspond to the non-display area NDA of the first substrate 110.

The touch sensing electrodes TSE may be disposed in the sensing area SA on a surface of the second substrate 120 facing the first substrate 110.

The touch sensing electrodes TSE may include a metal mesh. More particularly, the touch sensing electrodes TSE may include a plurality of conductive fine lines CFL which cross each other. The conductive fine lines CFL may include a plurality of first lines CFL1 extended in a predetermined direction, and a plurality of second lines CFL2 extended in a direction crossing the first lines CFL1.

A region formed through the crossing of the first lines CFL1 and the second lines CFL2 may correspond to the pixel area. That is, the display elements DD may be disposed in the region formed through the crossing of the first lines CFL1 and the second lines CFL2.

Areas where the first lines CFL1 cross the second lines CFL2 may correspond to the spacers SP. That is, the spacers SP may be disposed at the points at which the first lines CFL1 cross the second lines CFL2. Further, the second electrode CE should not be disposed on upper surfaces of the spacers SP. Instead, the second electrode CE may include openings OA overlapping the upper surfaces of the spacers SP.

The second electrode CE is not disposed on the upper surfaces of the spacers SP so as to prevent a parasitic capacitor from being formed between the second electrode CE and the conductive fine lines CFL on the upper surfaces of the spacers SP. Accordingly, this configuration prevents the touch sensitivity of the display device from being degraded.

If, contrary to the principles of the invention, the second electrode CE were to be disposed on the upper surfaces of the spacers SP, a parasitic capacitor may be formed between the second electrode CE and the conductive fine lines CFL disposed on the upper surfaces of the spacers SP heading the second substrate 120. A distance between the second electrode CE and the conductive fine lines CFL disposed on the upper surfaces of the spacers SP abutting the second substrate 120 may be much smaller than a distance between the second electrode CE and the conductive fine lines CFL in other regions in which the spacers SP are disposed. Accordingly, parasitic capacitance of the parasitic capacitor formed between the second electrode CE and the conductive fine lines CFL disposed on the upper surfaces of the spacers SP heading the second substrate 120 may be much larger than parasitic capacitance of the parasitic capacitor formed between the second electrode CE and the conductive fine lines CFL in other regions in which the spacers SP are disposed. The parasitic capacitor may degrade touch sensitivity of the display device.

A filling material FM may be disposed between the first substrate 110 and the second substrate 120. The filling material FM may include a material capable of decreasing external impact or external pressure. For example, the filling material FM may include a liquid polymer. The filling material FM may prevent the first substrate 110 or the second substrate 120 from being damaged due to the external impact or the external pressure. Further, the filling material FM may prevent the display elements DD from being damaged due to the external impact or the external pressure.

Hereinafter, a display device according to another exemplary embodiment of the invention will be described with reference to FIGS. 7, 8, 9, and 10. In FIGS. 7, 8, 9, and 10, the same constituent elements as those illustrated in FIGS. 1, 2, 3, 4, 5, and 6 are denoted by the same reference numerals, and will be briefly described. Further, in order to avoid overlapping descriptions in FIGS. 7 and 10, matters different from those in FIGS. 1, 2, 3, 4, 5, and 6 will be primarily described.

Figure 7:
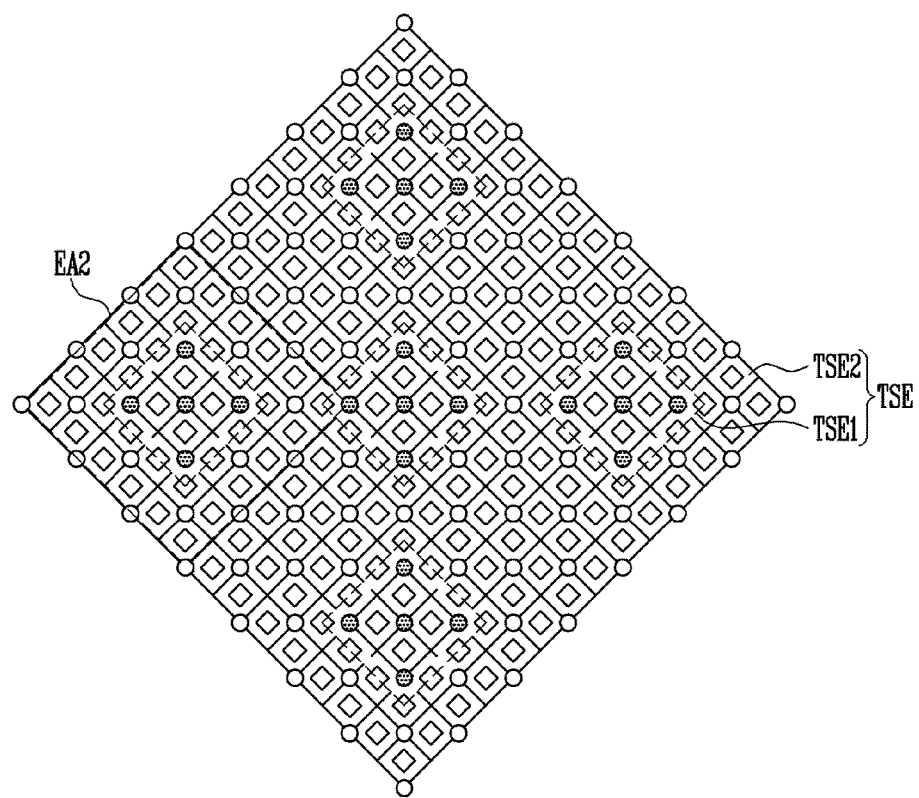
FIG. 7 is a top plan view illustrating a region, in which touch sensing electrodes are disposed, in a display device according to another exemplary embodiment of the invention.
Figure 8:
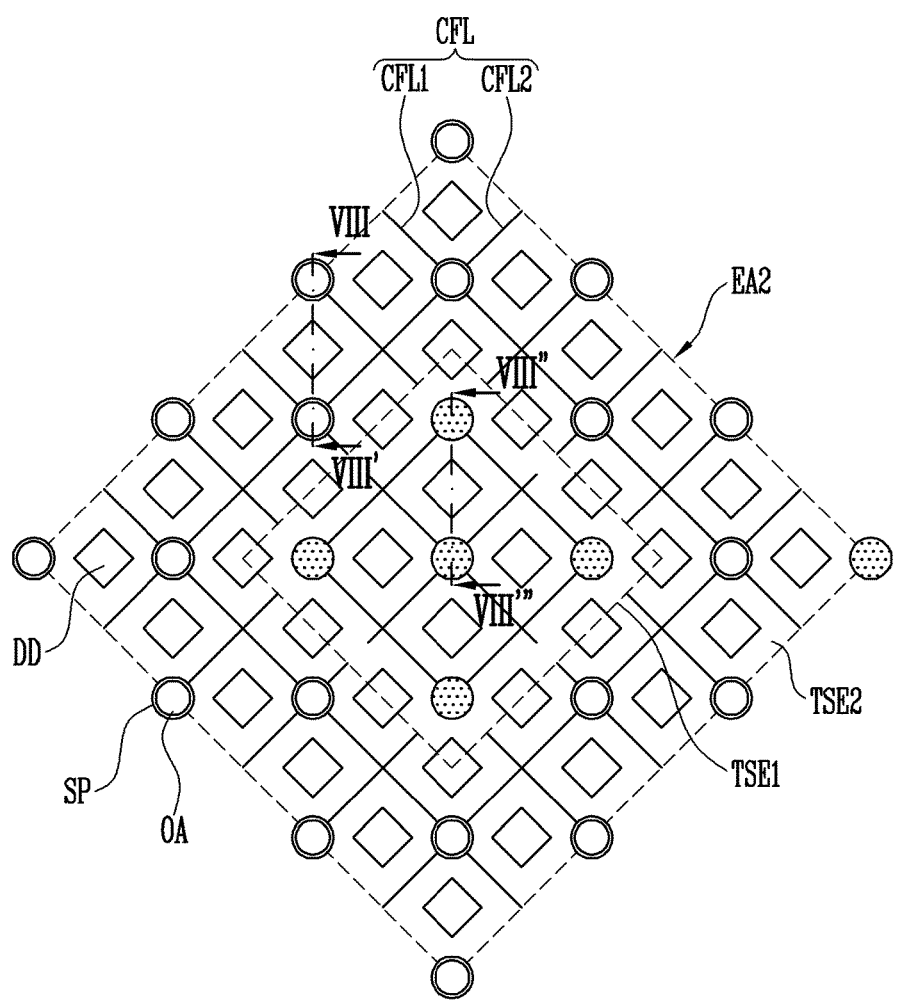
FIG. 8 is an enlarged view of region EA2 of FIG. 7.
Figure 9:
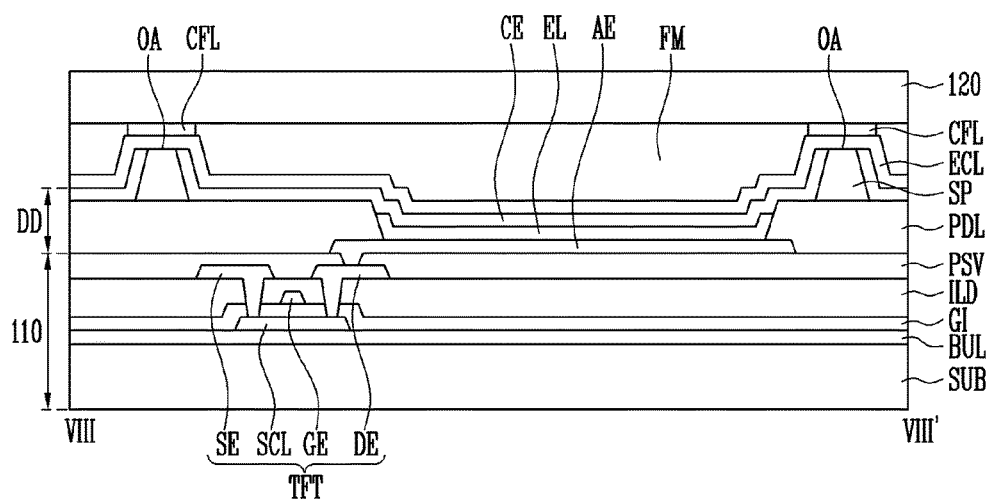
FIG. 9 is a cross-sectional view taken along line VIII-VIII' of FIG. 8.
Figure 10:
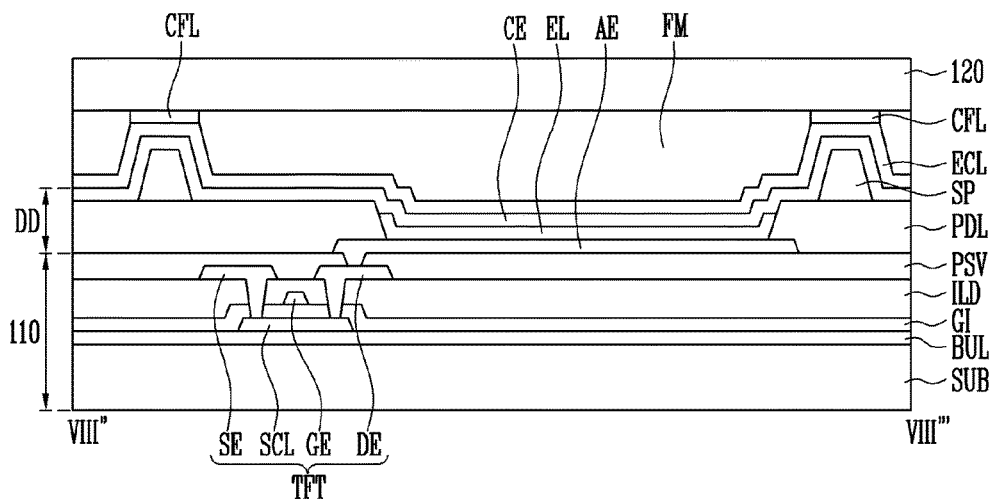
FIG. 10 is a cross-sectional view taken along line VIII"-VIII" of FIG. 8.

FIG. 7 is a top plan view illustrating a region, in which touch sensing electrodes are disposed, in a display device according to another exemplary embodiment of the invention. FIG. 8 is an enlarged view of region EA2 of FIG. 7. FIG. 9 is a cross-sectional view taken along line VIII-VIII' of FIG. 8. FIG. 10 is a cross-sectional view taken along line VIII"-VIII'" of FIG. 8.

Referring to FIGS. 1, 2, and 3, and FIGS. 7, 8, 9, and 10, the display device may include a first substrate 110, display elements DD disposed on the first substrate 110, a second substrate 120 facing the first substrate 110, and touch sensing electrodes TSE disposed on a surface of the second substrate 120 facing the first substrate 110.

The first substrate 110 may include a display area DA and a non-display area NDA. The display area DA may include a plurality of pixel areas. The non-display area NDA may be disposed to be adjacent to the display area DA. Further, the first substrate 110 may include a base substrate SUB, and one or more thin film transistors TFT disposed in each pixel area on the base substrate SUB.

A passivation layer PSV may be disposed on the base substrate BS on which the thin film transistors TFT are disposed. That is, the passivation layer PSV may cover the thin film transistor TFT.

The display elements DD may be disposed on the passivation layer PSV. The display elements DD may include a first electrode AE connected to the thin film transistor TFT, a pixel defining layer PDL, which exposes the first electrode AE, a plurality of spacers SP disposed on the pixel defining layer PDL, an emission layer EL disposed on the first electrode AE, which is adjacent to the pixel defining layer PDL, and a second electrode CE disposed on the emission layer EL. The second electrode CE may be extended to the pixel defining layer PDL and the spacers SP. The spacers SP may maintain a distance between the first substrate 110 and the second substrate 120.

The second substrate 120 may include a sensing area SA and a non-sensing area NSA disposed to be adjacent to the sensing area SA. The sensing area SA may correspond to the display area DA of the first substrate 110. The non-sensing area NSA may be disposed to be adjacent to the sensing area SA. Further, the non-sensing area NSA may correspond to the non-display area NDA of the first substrate 110.

The touch sensing electrodes TSE may be disposed in the sensing area SA on a surface of the second substrate 120 facing the first substrate 110.

The touch sensing electrodes TSE may include one or more first regions TSE1, and one or more second regions TSE2 separated from the first region TSE1. The first region TSE1 may be an electrically isolated region. Further, in a top plan view, the second region TSE2 may be configured in a shape surrounding the first region TSE1. That is, the first region TSE1 may have a shape of an island isolated within the second region TSE2.

The touch sensing electrodes TSE may include a plurality of conductive fine lines CFL which cross each other. The conductive fine lines CFL disposed in the first region TSE1 and the conductive fine lines CFL disposed in the second region TSE2 may be electrically separated. That is, the conductive fine lines CFL disposed in the first region TSE1 may be in an electrically isolated state from the conductive fine lines CFL disposed in the second region TSE2.

The touch sensing electrodes TSE may include a plurality of conductive fine lines CFL which cross each other. The display elements DD may be disposed in a region formed by crossing the conductive fine lines CFL. The spacers SP may be disposed at points, at which the conductive fine lines CFL cross.

In the first region TSE1, the second electrode CE may be extended up to the upper surfaces of the spacers SP. That is, in the first region TSE1, the second electrode CE may not include an opening OA. Further, the conductive fine lines CFL are electrically isolated in the first region TSE1. Accordingly, in the first region TSE1, a parasitic capacitor may not be formed between the second electrode CE and the conductive fine lines CFL.

In the second region TSE2, the second electrode CE may be formed to have a shape in which the region corresponding to the upper surfaces of the spacers SP is removed. That is, in the second region TSE2, the second electrode CE may include the opening OA located on the upper surfaces of the spacers SP, and the opening OA may be disposed in the second region TSE2. Accordingly, it is possible to prevent a parasitic capacitor from being formed between the second electrode CE and the conductive fine lines CFL in the upper surfaces of the spacers SP. Accordingly, this configuration prevents the touch sensitivity of the display device from being degraded.

In the this exemplary embodiment, the display device may prevent a voltage drop (IR-drop) phenomenon of the second electrode CE, compared to the display device including the second electrode illustrated in FIGS. 4, 5, and 6. The reason is that the second electrode CE does not include the opening OA in the first region TSE1.

Although certain exemplary embodiments and implementations have been described herein, other embodiments and modifications will be apparent from this description. Accordingly, the inventive concept is not limited to such embodiments, but rather to the scope of the appended claims and various modifications and equivalent arrangements that would be apparent to a skilled artisan.

What is claimed is:

1. A display device, comprising:
   a first substrate including a plurality of pixel areas;
   a plurality of display elements disposed in the plurality of pixel areas on the first substrate, respectively;
   a second substrate facing the first substrate;
   a plurality of spacers disposed between the plurality of display elements; and
   a plurality of touch sensing electrodes disposed on a surface of the second substrate facing the first substrate,
   wherein a display element, among the plurality of display elements, comprises:
   a first electrode disposed in a pixel area among the plurality of pixel areas;
   a pixel defining layer disposed between each pixel area among the plurality of pixel areas and exposing the first electrode;
   an emission layer disposed on the first electrode and including at least a light generating layer; and
   a second electrode disposed on the emission layer and extending to the pixel defining layer and the plurality of spacers, and
   wherein the plurality of spacers are disposed on the pixel defining layer and the second electrode comprises openings overlapping the plurality of spacers.

2. The display device of claim 1, wherein the plurality of touch sensing electrodes comprises a plurality of conductive fine lines crossing each other.

3. The display device of claim 2, wherein the plurality of spacers are disposed at points where the conductive fine lines cross.

4. The display device of claim 2, wherein the plurality of display elements are disposed in regions formed by crossing the plurality of conductive fine lines.

5. The display device of claim 1, wherein the plurality of touch sensing electrodes comprises one or more first regions and one or more second regions electrically separated from the first regions, and wherein the one or more first regions are electrically isolated from the one or more second regions.

6. The display device of claim 5, wherein the second region surrounds the first region.

7. The display device of claim 6, wherein the openings are disposed in the second region.

8. The display device of claim 7, wherein the plurality of touch sensing electrodes comprises a plurality of conductive fine lines crossing each other.

9. The display device of claim 8, wherein the plurality of spacers are disposed at points, at which the conductive fine lines cross, and the plurality of display elements are disposed in regions formed by crossing the plurality of conductive fine lines.

10. The display device of claim 1, further comprising:
an encapsulation layer disposed on the second electrode.

11. The display device of claim 1, further comprising:
a filling material disposed between the first substrate and the second substrate.

12. A display device, comprising:
a first substrate comprising a plurality of pixel areas;
a plurality of first electrodes disposed in the plurality of pixel areas, respectively;
a pixel defining layer disposed between each pixel area of the plurality of pixel areas and exposing the plurality of first electrodes;
a plurality of spacers disposed on the pixel defining layer;
an emission layer disposed on the first electrode and comprising at least a light generating layer;
a second electrode disposed on the emission layer and extended to the pixel defining layer and the plurality of spacers;
a second substrate facing the first substrate; and
a plurality of touch sensing electrodes disposed on a surface of the second substrate facing the second electrode and including a plurality of conductive fine lines crossing each other,
wherein the plurality of touch sensing electrodes comprises electrically isolated regions inside the plurality of touch sensing electrodes, and the plurality of conductive fine lines disposed in the isolated regions are electrically separated from the plurality of conductive fine lines disposed in an other region, and
wherein the second electrode comprises openings overlapping the plurality of spacers in the other region.

13. The display device of claim 12, wherein the other region surrounds the electrically isolated region.

14. The display device of claim 13, wherein the plurality of spacers are disposed at points where the conductive fine lines cross and display elements are disposed in regions formed at the crossing of the plurality of conductive fine lines.

* * * * *